US012656398B2

(12) United States Patent
Leonov et al.

(10) Patent No.: US 12,656,398 B2
(45) Date of Patent: Jun. 16, 2026

(54) SYSTEM AND METHOD FOR EVALUATING THE CONDITION OF AN ELECTRIC MACHINE

(71) Applicant: Siemens Energy, Inc., Orlando, FL (US)

(72) Inventors: Vladimir Leonov, Oviedo, FL (US); Harold Brassert, Pittsburgh, PA (US); Thomas I. Nelson, Oviedo, FL (US); Richard Mueller, Manor, PA (US)

(73) Assignee: SIEMENS ENERGY, INC., Orlando, FL (US)

( * ) Notice: Subject to any disclaimer, the term of this patent is extended or adjusted under 35 U.S.C. 154(b) by 156 days.

(21) Appl. No.: 18/845,905

(22) PCT Filed: Mar. 15, 2023

(86) PCT No.: PCT/US2023/064355
§ 371 (c)(1),
(2) Date: Sep. 11, 2024

(87) PCT Pub. No.: WO2023/183737
PCT Pub. Date: Sep. 28, 2023

(65) Prior Publication Data
US 2025/0244386 A1     Jul. 31, 2025

Related U.S. Application Data

(60) Provisional application No. 63/322,330, filed on Mar. 22, 2022.

(51) Int. Cl.
*G01R 31/34* (2020.01)

(52) U.S. Cl.
CPC ......... *G01R 31/346* (2013.01); *G01R 31/343* (2013.01)

(58) Field of Classification Search
CPC .... G01R 31/34; G01R 31/346; G01R 31/343; G01R 31/52
See application file for complete search history.

(56) References Cited

U.S. PATENT DOCUMENTS

| | | | | |
|---|---|---|---|---|
| 6,064,172 A * | 5/2000 | Kuznetsov | ........... | G01R 31/346 318/434 |
| 2011/0012637 A1* | 1/2011 | Hobelsberger | ......... | G01R 31/34 324/765.01 |

(Continued)

FOREIGN PATENT DOCUMENTS

| | | |
|---|---|---|
| KR | 20130118392 A | 10/2013 |
| KR | 20160125885 A | 11/2016 |

OTHER PUBLICATIONS

PCT International Search Report and Written Opinion of International Searching Authority mailed Jul. 13, 2023 corresponding to PCT International Application No. PCT/US2023/064355 filed Mar. 15, 2023.

(Continued)

*Primary Examiner* — Thang X Le

(57)          ABSTRACT

An electric machine includes laminations stacked along a longitudinal axis to define a stator core. The laminations cooperate to define a plurality of slots that extend in a direction parallel to the longitudinal axis, and include a first lamination, a second lamination, and an insulation layer between the first lamination and the second lamination. A plurality of windings is disposed in the plurality of slots, the plurality of windings operable to conduct a current at a desired voltage and a desired frequency. A sensor coil surrounds a portion of the laminations and conducts a first signal. A detector is electrically connected to the sensor coil to measure the first signal and to compare the first signal to a second signal, a difference between the first signal and the (Continued)

second signal being indicative of a short circuit between the first lamination and the second lamination.

20 Claims, 8 Drawing Sheets

(56)                    References Cited

U.S. PATENT DOCUMENTS

| | | | |
|---|---|---|---|
| 2011/0254562 A1* | 10/2011 | Hobelsberger | G01R 31/52 |
| | | | 324/521 |
| 2012/0206162 A1 | 8/2012 | Leonov | |
| 2013/0191041 A1 | 7/2013 | Guan et al. | |
| 2016/0314679 A1 | 10/2016 | Dodds et al. | |
| 2016/0370324 A1* | 12/2016 | Hobelsberger | G01N 27/82 |
| 2018/0348302 A1 | 12/2018 | Gamboa et al. | |

OTHER PUBLICATIONS

Sang Bin Lee et al: "An Advanced Technique for Detecting Interlaminar Stator Core Faults in Large Electric Machines"; Conference Record of the 2003 IEEE Industry Applications Conference. 38th. IAS Annual Meeting . Salt Lake City, UT, Oct. 12-16, 2003; [Conference Record of the IEEE Industry Applications Conference. IAS Annual Meeting], New York, NY : IEEE, US, vol. 2, Oct. 12, 2003 (Oct. 12, 2003), pp. 1374-1381, XP010676841, DOI: 10.1109/IAS.2003.1257730 ISBN.

Ramírez-Niño J et al: "Novel method for detecting interlamination short-circuits in a stator core based on measurement of eddy-current losses in power generators"; Measurement Science and Technology, IOP, Bristol, GB, vol. 14, No. 12, Dec. 1, 2003 (Dec. 1, 2003), pp. 2104-2110, XP020064934, ISSN: 0957-0233, DOI: 10.1088/0957-0233/14/12/009 / Jan. 12, 2003.

Romary R et al: "Detection of short circuits between stator laminations of electrical machine by analysis of external magnetic field", Electrical Machines, 2008. ICEM 2008. 18th International Conference on, IEEE, Piscataway, NJ, USA, Sep. 6, 2008 (Sep. 6, 2008), pp. 1-5, XP031436195, ISBN: 978-1-4244-1735-3 / Jun. 9, 2008.

* cited by examiner

1

SYSTEM AND METHOD FOR EVALUATING THE CONDITION OF AN ELECTRIC MACHINE

BACKGROUND

Generators, and in particular three-phase synchronous generators are often used on power generation activities to generate grid-suitable electricity using a prime mover such as a gas turbine, steam turbine, wind turbine, hydro turbine, and the like. The generators generally include a stator that remains stationary during operation and a rotor that rotates with respect to the stator. The rotor often includes two or more poles that when rotated interact with the stator to generate the desired current at the desired frequency and voltage.

During operation, insulation and other components can become less effective due to damage or wear. Inspections are often performed during planned or unplanned outages to detect these damaged components. However, finding this damage earlier would allow for planning that could reduce the cost and outage time for some repairs.

BRIEF SUMMARY

In one aspect, an electric machine includes a plurality of laminations stacked along a longitudinal axis to define a stator core. Each of the laminations of the plurality of laminations cooperates to define a plurality of slots that extend in a direction parallel to the longitudinal axis, the plurality of laminations including a first lamination, a second lamination, and an insulation layer between the first lamination and the second lamination. A plurality of windings is disposed in the plurality of slots, the plurality of windings operable to conduct a current at a desired voltage and a desired frequency. A sensor coil surrounds a portion of the plurality of laminations and conducts a first signal. A detector is electrically connected to the sensor coil to measure the first signal and to compare the first signal to a second signal, a difference between the first signal and the second signal being indicative of a short circuit between the first lamination and the second lamination.

In one aspect, a method of detecting a short circuit between a first lamination and a second lamination in a plurality of laminations arranged along a longitudinal axis to define a stator core includes surrounding a portion of the plurality of laminations with a first coil of a sensor coil disposed in a plane that is parallel to the longitudinal axis, measuring a first signal from the sensor coil, comparing the first signal to a second signal to identify a difference, and indicating the existence of the short circuit in response to the difference.

In one aspect, an electric machine includes a plurality of laminations stacked along a longitudinal axis, and a plurality of insulation layers arranged such that one insulation layer is disposed between adjacent laminations of the plurality of laminations. A first coil is positioned to surround the plurality of laminations and the plurality of insulation layers and arranged on a first side of the longitudinal axis in a plane that includes the longitudinal axis, and a second coil is positioned to surround the plurality of laminations and the plurality of insulation layers and arranged on a second side of the longitudinal axis in the plane, the second side on the opposite side of the longitudinal axis as the first side. The first coil and the second coil are connected in series. A detector is electrically connected to the first coil and the second coil to measure a first signal and to compare the first signal to a reference signal, a difference between the first signal and the reference signal being indicative of a damaged insulation layer.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
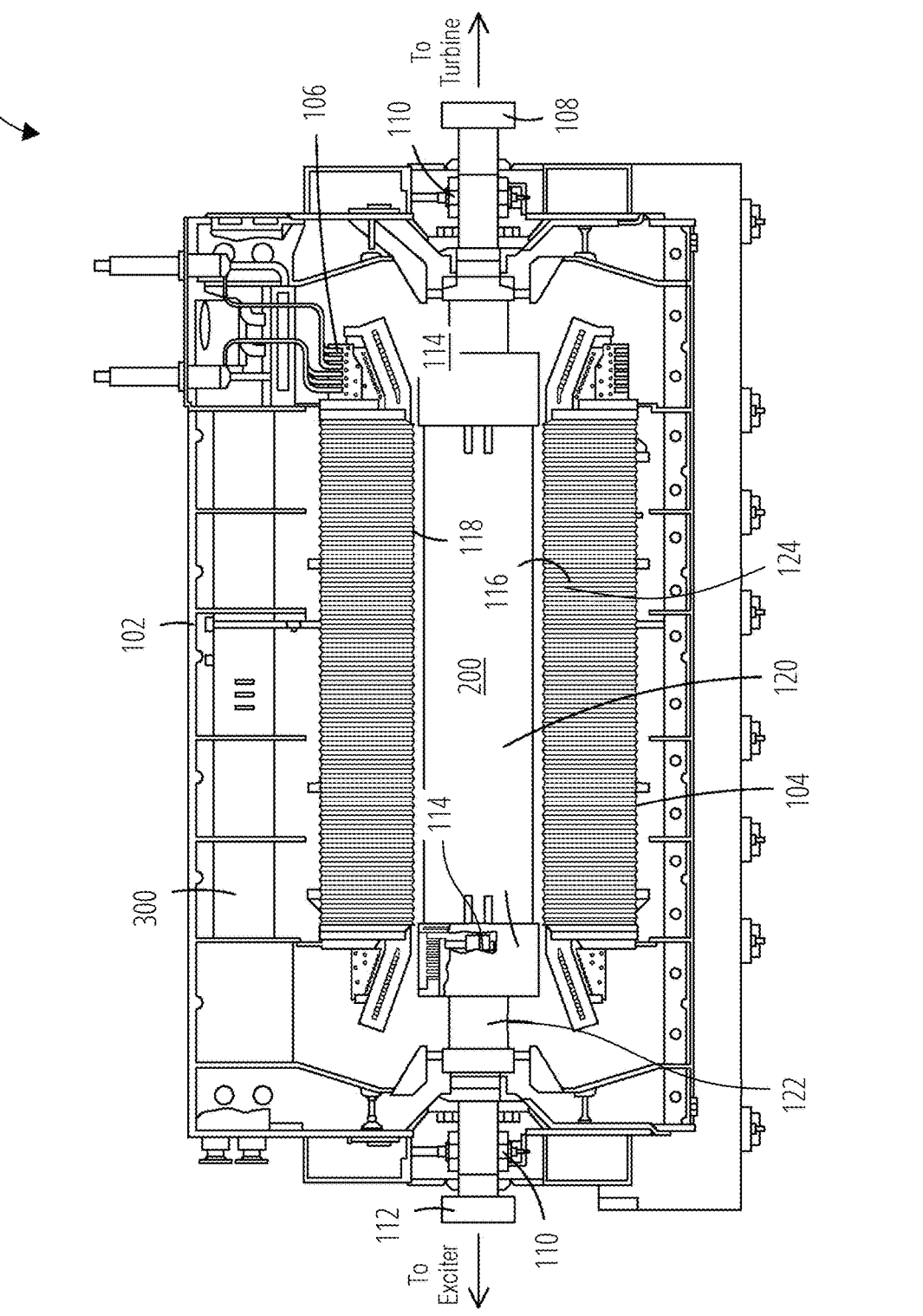
FIG. 1 is a cross-sectional view of a generator taken along the generator centerline, rotational, or longitudinal axis.

Before any embodiments of the invention are explained in detail, it is to be understood that the invention is not limited in its application to the details of construction and the arrangement of components set forth in this description or illustrated in the following drawings. The invention is capable of other embodiments and of being practiced or of being carried out in various ways. Also, it is to be understood that the phraseology and terminology used herein is for the purpose of description and should not be regarded as limiting.

Various technologies that pertain to systems and methods will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

Also, it should be understood that the words or phrases used herein should be construed broadly, unless expressly limited in some examples. For example, the terms "including," "having," and "comprising," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Furthermore, while multiple embodiments or constructions may be described herein, any features, methods, steps, components, etc. described with regard to one embodiment are equally applicable to other embodiments absent a specific statement to the contrary.

Also, although the terms "first", "second", "third" and so forth may be used herein to refer to various elements, information, functions, or acts, these elements, information, functions, or acts should not be limited by these terms. Rather these numeral adjectives are used to distinguish different elements, information, functions or acts from each other. For example, a first element, information, function, or act could be termed a second element, information, function, or act, and, similarly, a second element, information, function, or act could be termed a first element, information, function, or act, without departing from the scope of the present disclosure.

In addition, the term "adjacent to" may mean that an element is relatively near to but not in contact with a further element or that the element is in contact with the further portion, unless the context clearly indicates otherwise. Further, the phrase "based on" is intended to mean "based, at least in part, on" unless explicitly stated otherwise. Terms "about" or "substantially" or like terms are intended to cover variations in a value that are within normal industry manufacturing tolerances for that dimension. If no industry standard is available, a variation of twenty percent would fall within the meaning of these terms unless otherwise stated.

Electric machines such as generators or motors are used to convert mechanical power into electrical energy (a generator) or to convert electrical power into mechanical power or work (a motor). The figures herein illustrate an electric machine in the form of a generator 100. However, the components, features, methods, and systems described herein are equally applicable to other electric machines unless explicitly stated otherwise. As illustrated in FIG. 1, the generator 100 includes a stator 300 and a rotor 200 supported for rotation within the stator 300. The stator 300 includes a stator housing 102 that surrounds and substantially encloses a stator core 104. The stator core 104 is often made-up of a number of stator laminations 116 stacked in a longitudinal direction (along a rotational axis or longitudinal axis). Insulation layers are positioned between adjacent stator laminations 116 to inhibit short circuits and unwanted circulating currents. Each stator lamination 116 and insulation layer 124 includes cut outs or is otherwise shaped to define the desired features of the stator core 104, including a bore 118 that is sized to receive the rotor 200.

In some constructions, a stator cooling system 106 is provided to cool the stator 300 and improve the efficiency and power density of the stator 300. In some constructions, a cooling gas is employed as a stator coolant. However, larger stators 300 may include liquid cooling such as water cooling.

The rotor 200 includes a rotor core 120, a rotor shaft 122, and two retaining rings 114 coupled to the rotor shaft 122. The illustrated rotor shaft 122 is supported for rotation by a bearing 110 positioned at each end of the rotor 200. A turbine coupling 108 is positioned at one end of the rotor 200 to facilitate connection of the rotor 200 to a turbine (e.g., combustion turbine, steam turbine, hydro turbine, wind turbine, etc.) or to another prime mover. The opposite end of the rotor 200 may include an exciter coupling 112 that allows for connection to an exciter or other rotating equipment.

The generator 100 illustrated in FIG. 1 is a synchronous generator 100. However, asynchronous generators, motors, or other electric machines could include the features described herein with the illustrated generator 100 being but one example.

Figure 2:
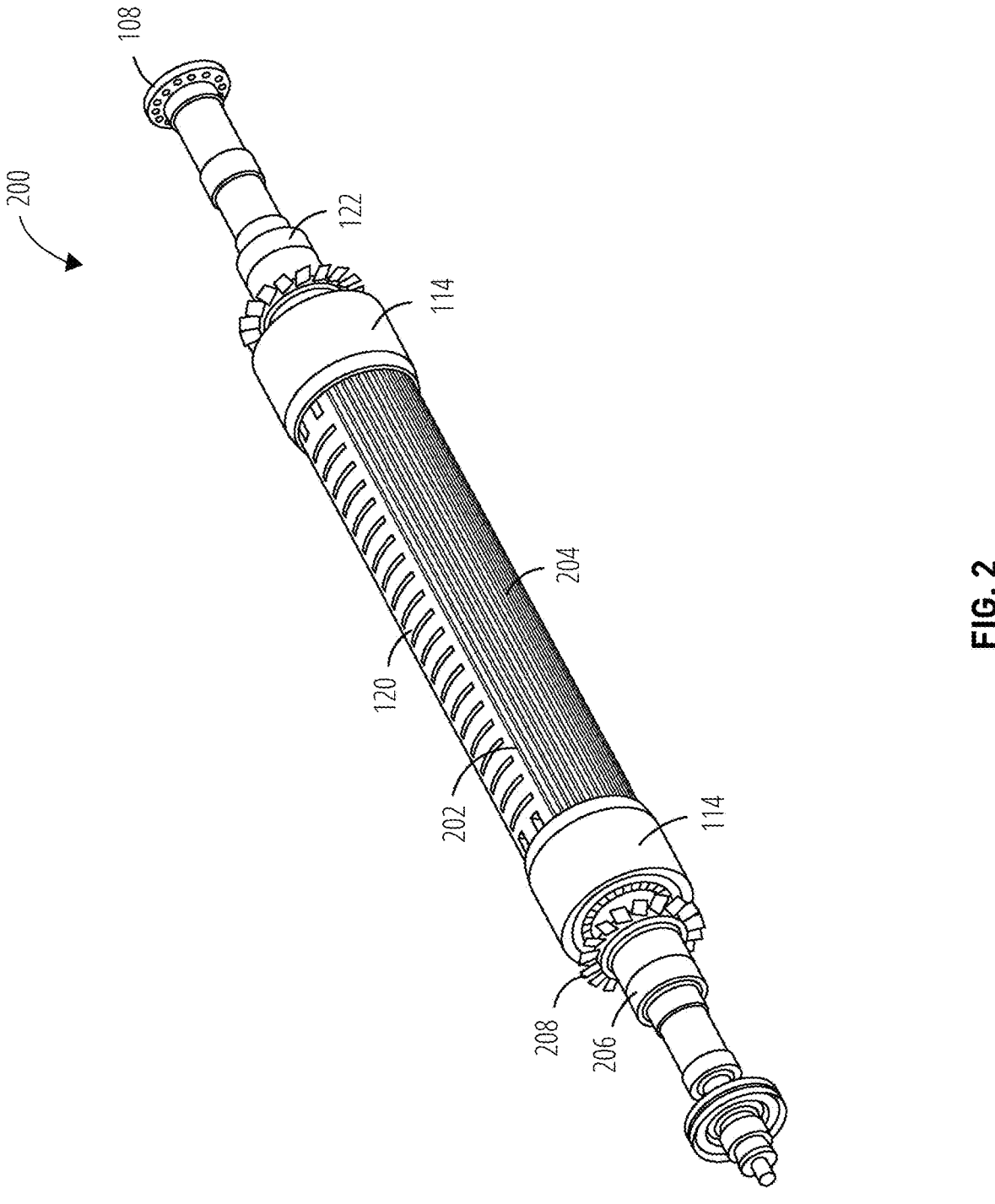
FIG. 2 is a perspective view of a rotor suitable for use in the generator of FIG. 1.

FIG. 2 illustrates the rotor 200 of FIG. 1 in greater detail. The rotor core 120 includes a series of rotor slots 202 that extend longitudinally along the rotor core 120. Rotor windings 204 are positioned within the rotor slots 202 to define one or more pairs of poles. In the illustrated construction two poles are formed by the rotor windings 204. However, other constructions could include four poles, eight poles or more poles if desired. The rotor 200, sometimes referred to as a field, may also include a commutator 206 that provides a connection to an exciter that provides electrical current at a desired voltage to the windings 308 to generate a magnetic field.

The rotor 200 may also include a rotor cooling system 208 that operates to cool the rotor 200. In some constructions, the rotor 200 is air-cooled with other constructions employing another fluid such as hydrogen.

Figure 3:
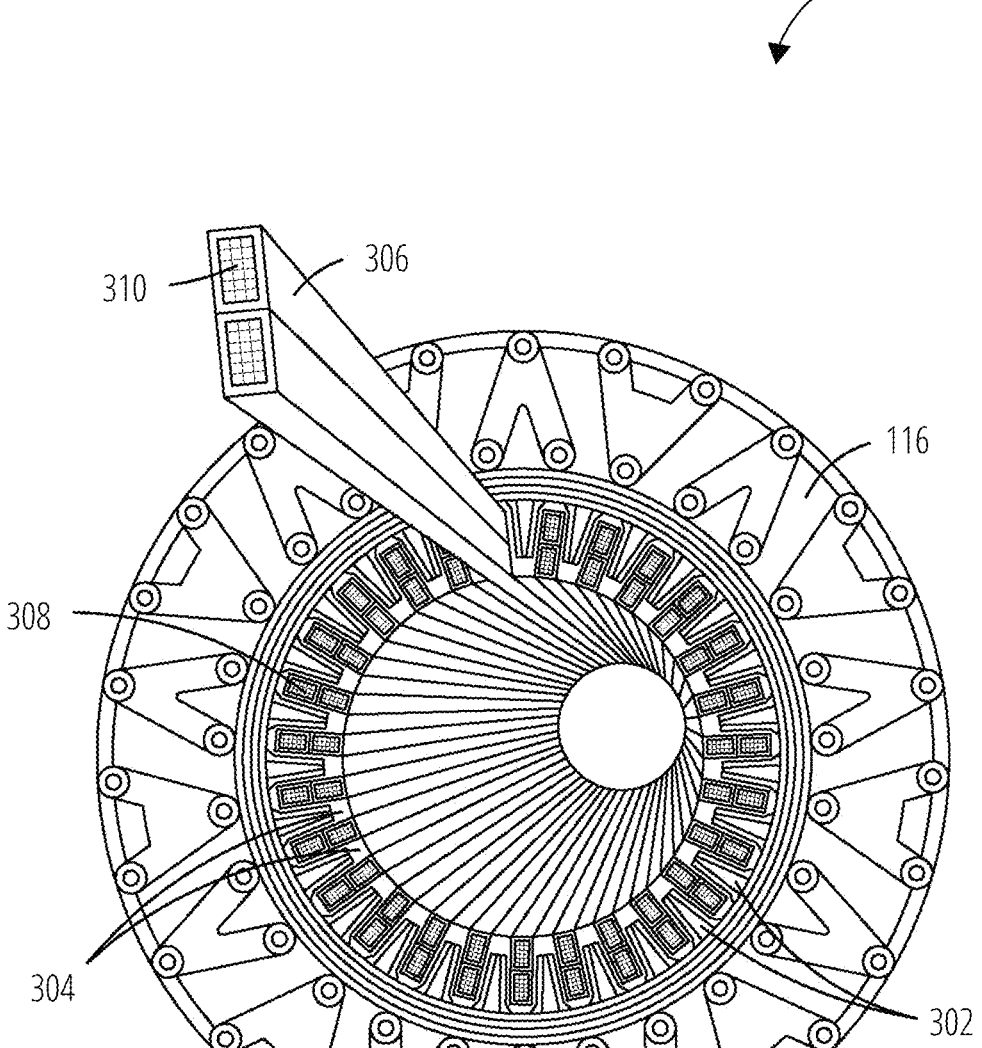
FIG. 3 is a perspective view of a portion of a stator suitable for use in the generator of FIG. 1.

Turning to FIG. 3, the stator core 104 is illustrated in greater detail. The stator core 104, in most constructions is formed from a series of stator laminations 116 that are stacked along the longitudinal axis with insulation layers 124 (best illustrated in FIG. 12) disposed between adjacent stator laminations 116. Each stator lamination 116, and insulation layer 124 includes cut-outs, openings or features that when stacked define the desired features of the stator core 104. Each of the stator laminations 116 and insulation layers 124 include a number of teeth 302 that are evenly spaced circumferentially around the bore 118. The teeth 302 cooperate to define a plurality of slots that extend the length of the stator core 104. Bars 306 are positioned within each slot and are electrically connected to one another to define a series or plurality of windings 308. In the illustrated generator 100, the windings 308 are arranged to define three phases. Generally, the three phases are electrically arranged to define a delta-circuit or a Y-circuit as may be desired. Of course, other constructions could include a single phase if desired.

As part of the stator cooling system 106, each of the bars 306 may include one or more coolant passages 310 that allow for the flow of coolant along the length of the bar 306. As discussed, a coolant fluid such as water is often employed to cool the generator.

During prolonged operation of the electric machine or generator 100, one or more of the insulation layers 124 between adjacent stator laminations 116 may wear out which can lead to a short circuit between the adjacent stator laminations 116. These short circuits can lead to unwanted circulating currents and local overheating that lead to inefficient operation of the generator and ultimately to a failure that may require a forced outage or expensive maintenance process.

Some tests and inspection techniques are available to detect these insulation failures. However, all of them must be done during extended maintenance operations and as such are done periodically (e.g., several years apart). In addition, the inspections are performed during an outage and any findings may lead to unplanned work that must be performed on a rush basis, further increasing the costs and potentially the outage time for the electric machine.

Figure 4:
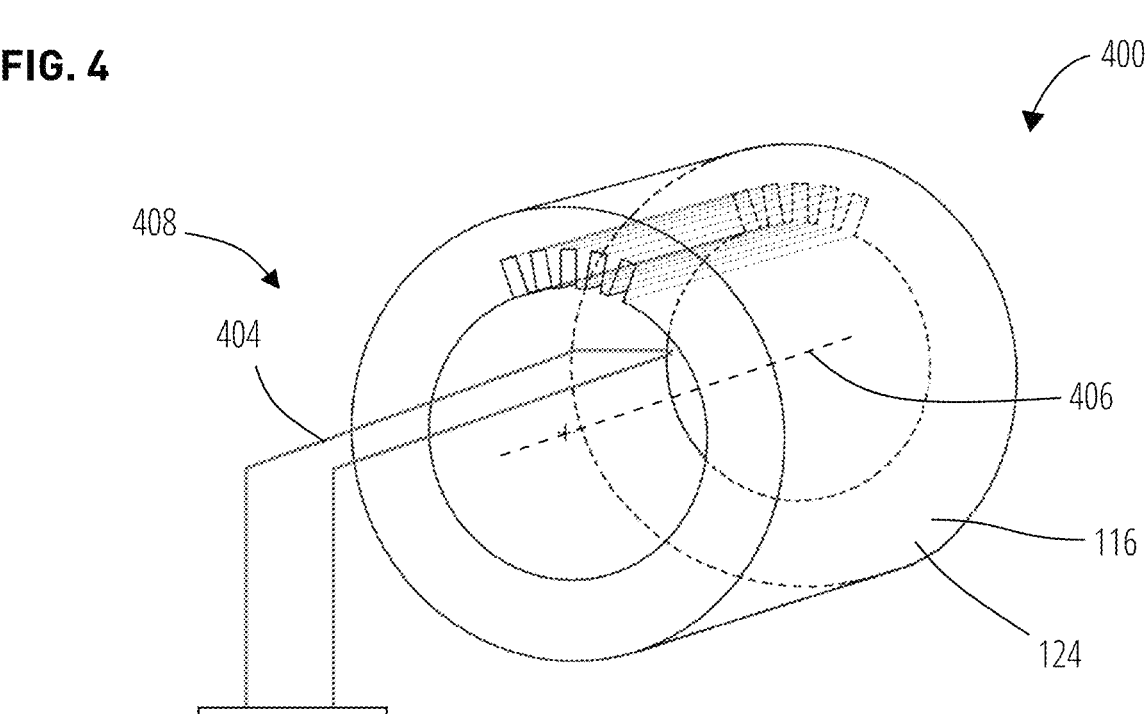
FIG. 4 is a schematic illustration of a passive sensor system that is operable to detect short circuits between stator laminations.
Figures 12, 13, 14:
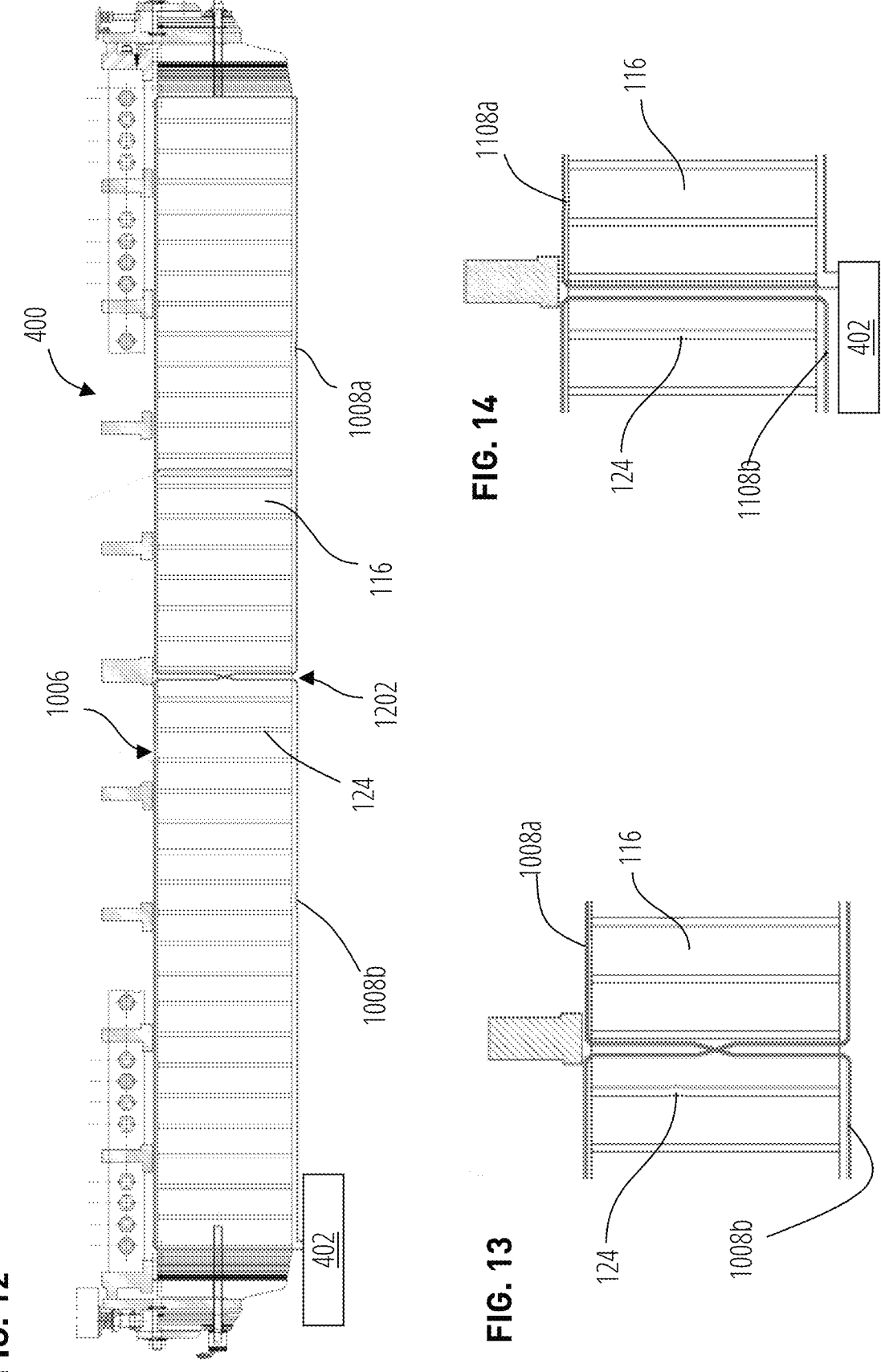
FIG. 12 is a schematic illustration of a coil of FIG. 10 formed from a first subcoil and a second subcoil.
FIG. 13 schematically illustrates a series connection of the first subcoil and the second subcoil of FIG. 12.
FIG. 14 schematically illustrates the arrangement of the first subcoil and the second subcoil of FIG. 11.

FIG. 4 illustrates a stator core 400 that includes a plurality of stator laminations 116 stacked along a longitudinal axis 406 (best illustrated in FIG. 12). An insulation layer 124 (best illustrated in FIG. 12) is positioned between adjacent stator laminations 116 to inhibit unwanted electrical conductivity and circulating current.

The stator core 400 includes a sensor system 408 that operates to detect flaws or damage to the insulation layers 124 between the stator laminations 116 while the generator 100 or electric machine is operating. The sensor system 408 can be a passive system as illustrated in FIG. 4 through FIG. 7 or an active system as illustrated in FIG. 8 through FIG. 11. Of course, aspects of the passive and active systems may be interchangeable such that features described with regard to one of the passive or active systems are equally applicable to the other of the passive or active system.

The sensor system 408 includes a sensor coil 404 made up of a single coil that surrounds at least a portion of the stator laminations 116 that make up the stator core 400. The sensor coil 404 is formed from one or more windings that extend around the stator laminations 116 in a plane that contains the longitudinal axis 406.

A detector 402 is electrically connected to the sensor coil 404 to receive a signal or waveform from the sensor coil 404. The detector 402 may be microprocessor based or may include other components that allow for the comparison of the signal or waveform received from the sensor coil 404 to another signal or waveform. In addition, the detector 402 may include memory or storage that allows for the storage of a reference signal or waveform, or a detected signal or waveform from an earlier time period.

The sensor system 408 of FIG. 4 operates in response to operation of the stator core 400 and as such is considered passive. Specifically, operation of the stator core 400 induces magnetic fields and electrical currents within the stator core 400 that in turn induce a voltage or current in the sensor coil 404. This signal or waveform is then delivered or detected by the detector 402. Because the sensor coil of FIG. 4 includes only a single coil, a second signal stored by the detector 402 is required for comparison with the signal produced by the sensor coil 404. One could store a prior signal measured by the sensor coil 404 (i.e., a signal collected in the past) or a reference signal that is known to be produced by the stator core 400 with no flaws in the insulation layers 124. If the comparison shows a difference between the signal from the sensor coil 404 and the reference or stored signal, the detector 402 will identify it as a potential insulation failure. The detected difference could be a difference in voltage, current, waveform and the like. In addition, the size and shape of the difference could be indicative of the type of failure, the size of the failure and in some arrangements the general location of the failure.

Figure 5:
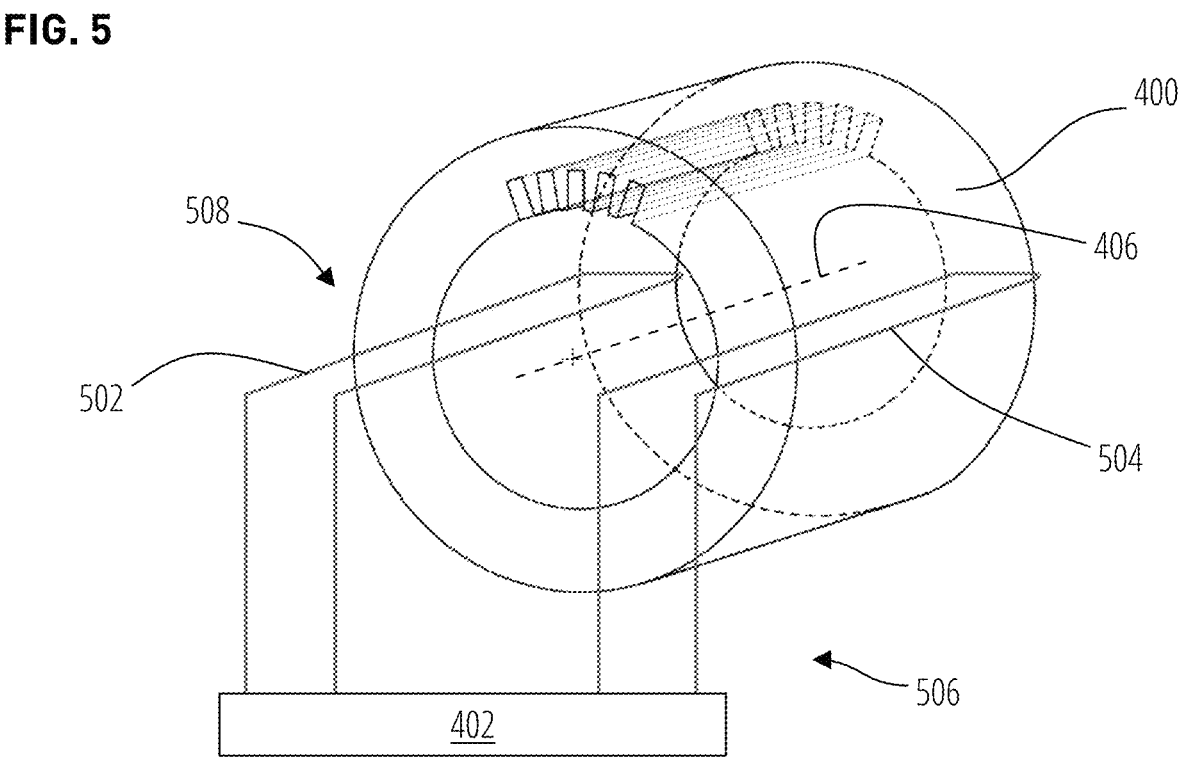
FIG. 5 is a schematic illustration of another passive sensor system that is operable to detect short circuits between stator laminations.

FIG. 5 illustrates another arrangement of a sensor system 506 and in particular a passive sensor system 506 applied to the stator core 400. The sensor system 506 includes a sensor coil 508 that includes a first coil 502 and a second coil 504. The first coil is arranged identically to the sensor coil 404 described with regard to the sensor system 408 of FIG. 4. The second coil 504 is similar to the first coil 502 and is arranged in the same plane as the first coil but is positioned on the opposite side of the longitudinal axis 406 as the first coil 502. Preferably, the second coil 504 includes the same number of turns as the first coil 502 and it surrounds the same stator laminations 116 as the first coil 502. With the first coil 502 and the second coil 504 properly positioned, generally opposite one another, they each generate a signal or waveform, with those signals or waveforms being generally opposite one another. In other words, the first coil 502 generates a first signal and the second coil 504 generates a second signal with the first signal and the second signal being substantially the same as one another with opposite polarity, assuming no insulation layers 124 are damaged.

The detector 402 in the arrangement of FIG. 5 compares the first signal to the second signal rather than comparing the first signal to a stored signal or a reference signal. Thus, the sensor system 506 does not need to store a reference signal. If the comparison between the first signal and the second signal shows a difference, the detector 402 will identify it as a potential insulation failure. The detected difference could be a difference in voltage, current, waveform and the like. In addition, the size and shape of the difference could be indicative of the type of failure, the size of the failure and in some arrangements the general location of the failure.

In some constructions, the detector 402 may also store a signal or waveform to use for comparison with both the first signal and the second signal to determine which of the signals has changed. This would allow for a more accurate estimation of the position of any detected failure in the insulation layers 124.

Figure 6:
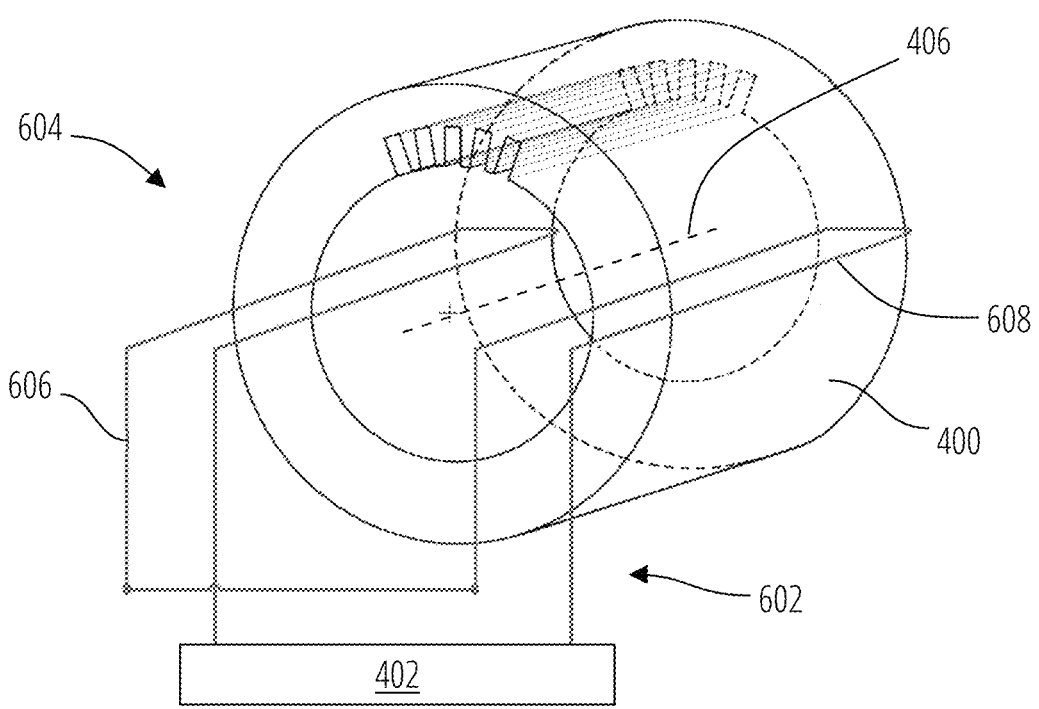
FIG. 6 is a schematic illustration of another passive sensor system that is operable to detect short circuits between stator laminations.

FIG. 6 illustrates another arrangement of a sensor system 602. The sensor system 602 includes a sensor coil 604 that is very similar to the sensor coil 508 in that it includes a first coil 606 and a second coil 608 arranged in a single plane and disposed on opposite sides of the longitudinal axis 406. However, rather than generating two signals as in the arrangement of FIG. 5, the first coil 606 and the second coil 608 are connected in series and then connected to the detector 402. Thus, only a single signal, that is essentially the sum or combination of the signals from the first coil 606 and the second coil 608 is delivered to the detector 402. The delivered signal is compared to an expected or reference signal by the detector 402 to determine if there is a potential short between stator lamination 116.

For example, if the stator core 400 is undamaged and the positions of the first coil 606 and the second coil 608 are properly located, the two signals would have equal amplitudes and opposite polarity, thereby producing a zero-voltage signal. Any voltage above or below zero could be indicative of a failure in the insulation layers 124.

The arrangement of FIG. 6 is again passive in that it requires operation of the stator core 400 to generate the signal. In addition, the comparison of the signal produced by the first coil 606 and the second coil 608 can not only detect a potential short between adjacent stator laminations 116 but can also predict the area or potential location of the short based on the phase and shape of the signal. For example, the polarity of the comparison between the first signal and the reference signal (e.g., zero voltage) may indicate which side of the stator core 400 includes the short between the stator laminations 116 (e.g., nearer to the first coil 606 or nearer to the second coil 608).

Figure 7:
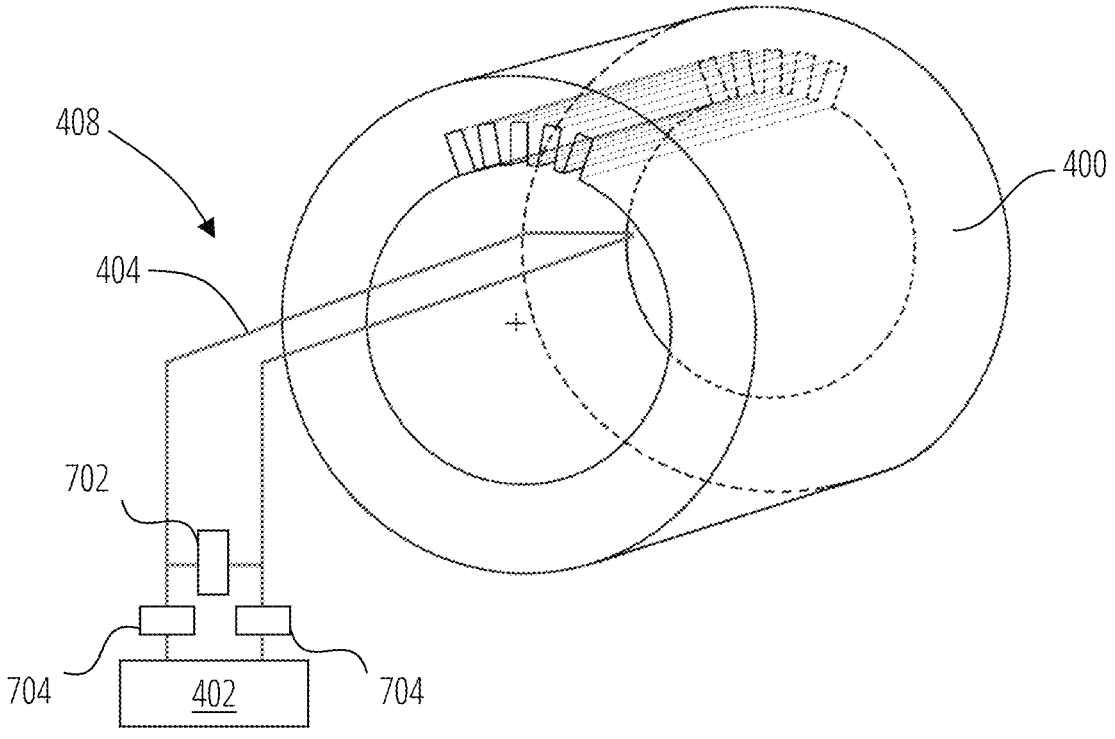
FIG. 7 is a schematic illustration of another passive sensor system that is operable to detect short circuits between stator laminations.

FIG. 7 illustrates the sensor system 408 of FIG. 4 with the addition of a parallel electrical element 702 and a series electrical element 704 on each leg of the sensor coil 404 and positioned between the stator core 400 and the detector 402.

The parallel electrical element 702 and each of the series electrical elements 704 may include one or more resistors, inductors, capacitors, solid state components, and the like arranged in series or parallel with one another to condition the signal produced by the sensor coil 404 in any manner desired. The sensor system 408 could include only the parallel electrical element 702, only one of the series electrical elements 704, or any combination of the parallel electrical element 702 and the series electrical elements 704 as may be desired to achieve the desired conditioned signal.

It should be noted that the parallel electrical element 702 and the series electrical elements 704 could be applied to any arrangement of the sensor system described herein. The use of the parallel electrical element 702 and the series electrical elements 704 should not be limited to only the sensor system 408.

Figures 8, 9:
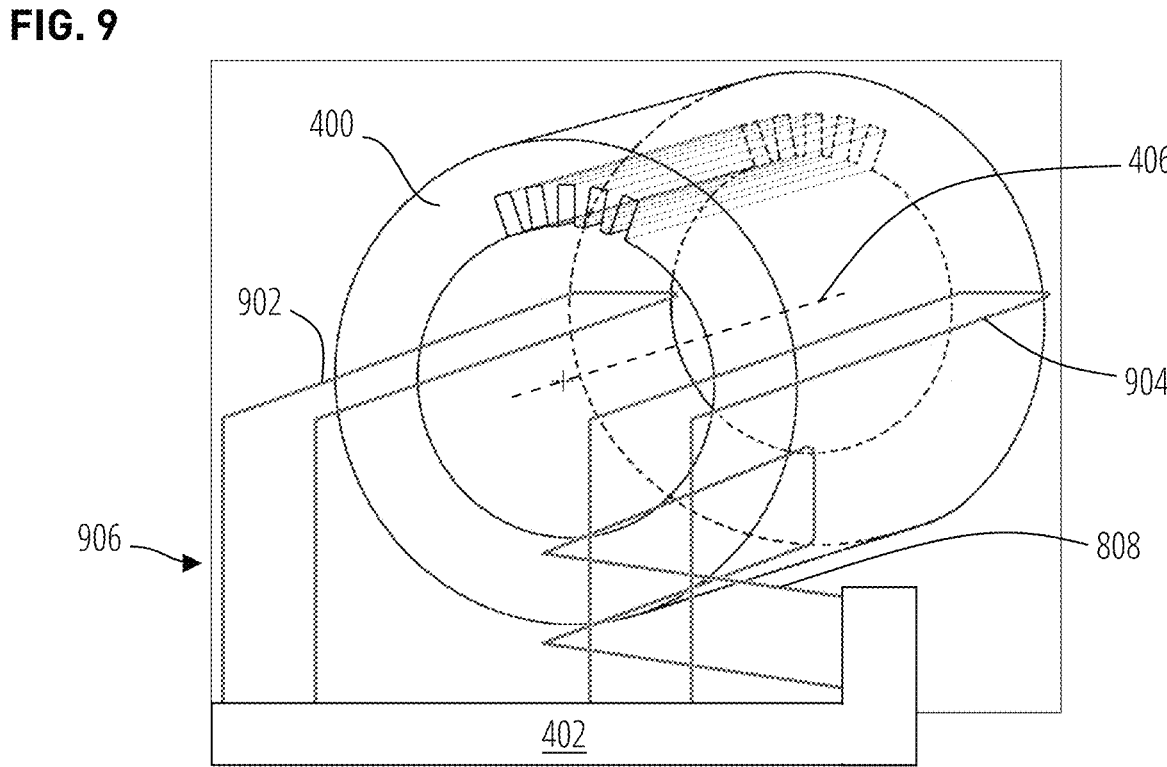
FIG. 8 is a schematic illustration of an active sensor system that is operable to detect short circuits between stator laminations.
FIG. 9 is a schematic illustration of another active sensor system that is operable to detect short circuits between stator laminations.

FIG. 8 and FIG. 9 illustrate additional sensor systems that are active in nature rather than passive. With reference to FIG. 8, a sensor system 802 includes a first coil 804 and a second coil 806 arranged much like the first coil 606 and the second coil 608 of the sensor system 602 of FIG. 6. Specifically, the first coil 804 and the second coil 806 are connected in series to combine the signals from the coils into a single signal that is then delivered to the detector 402 as described with regard to FIG. 6.

The sensor system 802 also includes an excitation coil 808 that is formed around a portion of the stator laminations 116 in a plane that is separate from the plane that contains the first coil 804 and the second coil 806. In preferred arrangements, the portion of stator laminations 116 surrounded by the excitation coil 808 is the same as those surrounded by the first coil 804 and the second coil 806. The excitation coil 808 is connected to the detector 402 or to another device that is operable to generate an excitation signal.

In use, the detector 402, or another component generates an excitation signal having a known frequency and voltage. In preferred constructions, the frequency and voltage are different from the normal operating frequency and voltage of the generator 100. The first coil 804 and the second coil 806 are wound around the same portion of the stator laminations 116 at opposite sides of the longitudinal axis 406 from one another. The excitation signal induces a reaction in the laminations that may include magnetic flux variations and/or eddy currents. These flux variations and/or eddy currents in turn induce a voltage and/or current in each of the first coil 804 and the second coil 806.

With the first coil 804 and the second coil 806 arranged opposite one another and connected in series, under ideal conditions the coils would generate signals of equal and opposite voltage in response to the excitation signal such that the series signal would have zero voltage. If, however, the stator core 400 includes a short between stator laminations 116, the short will affect one of the first coil 804 and the second coil 806 more than the other resulting in an unbalanced signal, or a signal with a voltage and frequency that corresponds to the excitation signal. The inclusion of an excitation coil 808 allows for the testing of the stator core 400 at any time during operation or during periods when the stator core 400 is not operating.

FIG. 9 illustrates another arrangement of an active sensor system 906. The sensor system 906 includes a first coil 902 and a second coil 904 arranged like the first coil 502 and the second coil 504 of the passive sensor system 506 of FIG. 5. It should be noted that the arrangement illustrated in FIG. 9 could include only the first coil 902 similar to the arrangement of FIG. 4.

Each of the first coil 902 and the second coil 904 are connected to the detector 402 to allow the detector 402 to compare the signals received from each of the first coil 902 and the second coil 904. As with the prior arrangements, the arrangement of the first coil 902 and the second coil 904 are such that under ideal operating conditions, the signals received are equal in voltage but have opposite polarities. The detector 402 compares the signals received from the first coil 902 and the second coil 904 and if an unbalanced condition is detected, the detector 402 may identify it as a potential short between stator laminations 116. In addition, a determination of which signal changed, may be indicative of a location of the short.

The sensor system 906 of FIG. 9 further includes an excitation coil 808 that is connected to the detector 402 or to another device that operates to generate an excitation signal. The excitation coil 808 surrounds a portion of the stator laminations 116, and preferably the same portion of stator laminations 116 as the first coil 902 and the second coil 904. However, the excitation coil 808 is positioned in a plane that is different from the plane that contains the first coil 902 and the second coil 904. In the constructions illustrated in FIG. 8 and FIG. 9, the excitation coil 808 is positioned in a plane that is orthogonal to the plane that contains the first coil 902 and the second coil 904. However, other positions are possible.

In operation of the arrangement of FIG. 9, the detector 402 or another signal generating device generates the excitation signal having a desired frequency and voltage and transmits that signal to the stator core 400 via the excitation coil 808. The excitation signal excites the stator core 400 and induces magnetic fluxes and electrical currents within the stator laminations 116. These fluxes and currents in turn induce the first signal in the first coil 902 and the second signal in the second coil 904.

The detector 402 receives the first signal and the second signal and compares the signals to determine if there is a potential short between stator laminations 116. As with the prior embodiments, the first signal and the second signal should have equal voltages of opposite polarity with any imbalance being indicative of a potential short between stator laminations 116 and in some cases the location of the short.

Figure 10:
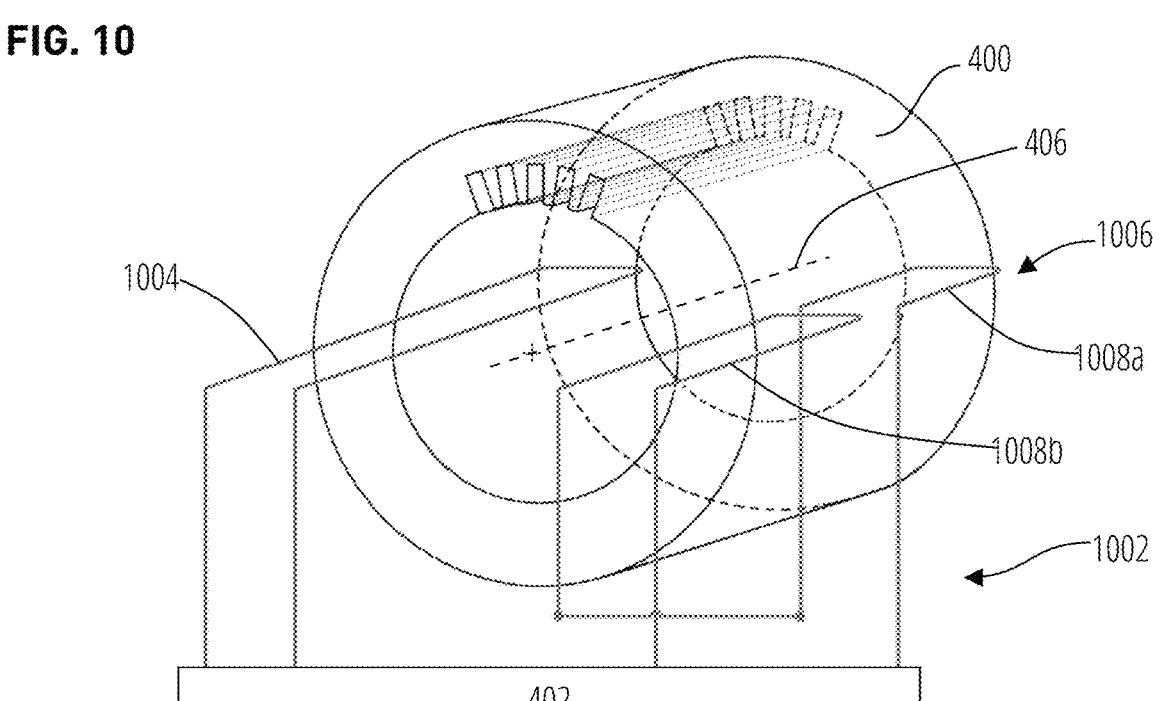
FIG. 10 is a schematic illustration of another active sensor system that is operable to detect short circuits between stator laminations.

FIG. 10 illustrates another arrangement of an active sensor system 1002 that is similar to the sensor system of FIG. 5. The sensor system 1002 of FIG. 10 includes a first coil 1004 that is arranged similar to the first coil 502 and can be an active or excitation coil or a passive coil that is connected to the detector 402 to transmit an excitation signal and/or receive the first signal.

The sensor system 1002 also includes a second coil 1006 that is subdivided into a first subcoil 1008a and a second subcoil 1008b. The first subcoil 1008a and the second subcoil 1008b are arranged in the same plane as the first coil 1004 but are on the opposite side of the longitudinal axis 406. Together, the first subcoil 1008a and the second subcoil 1008*b* surround the same portion of the stator laminations 116 as are surrounded by the first coil 1004. In the illustrated construction, the first subcoil 1008*a* surrounds the stator laminations 116 that extend from one end of the stator core 400 to a point 1202 between the first end and the second end of the stator core 400. The second subcoil 1008*b* surrounds the stator laminations 116 from the point 1202 where the first subcoil 1008*a* ends to the second end of the stator core 400. The point 1202 may be selected such that the first subcoil 1008*a* and the second subcoil 1008*b* produce similar signals. Thus, a failure of the insulation layer 124 in an area surrounded by one of the first subcoil 1008*a* and the second subcoil 1008*b* produces a difference between the two signals. The first subcoil 1008*a* and the 1008*b* are connected in series so that they cooperate to define a single second signal that is then delivered to the detector 402.

The sensor system 1002 operates in much the same way as the sensor system 506 (but includes an active coil). However, dividing the second coil 1006 into the first subcoil 1008*a* and the second subcoil 1008*b* allows the detector 402 to better determine an axial position of any short between the stator laminations 116. Specifically, the detector 402 can determine which of the signals from the first subcoil 1008*a* and the second subcoil 1008*b* has changed to isolate the axial position of the insulation layer 124 that may have failed.

It should be noted that the sensor system 1002, could be either passive or active. If passive, each of the first coil 1004, the first subcoil 1008*a*, and the second subcoil 1008*b* are passive coils. However, the sensor system 1002 is active, the first coil 1004 would be active like the excitation coil 808 that operates to provide an excitation signal.

Figure 11:
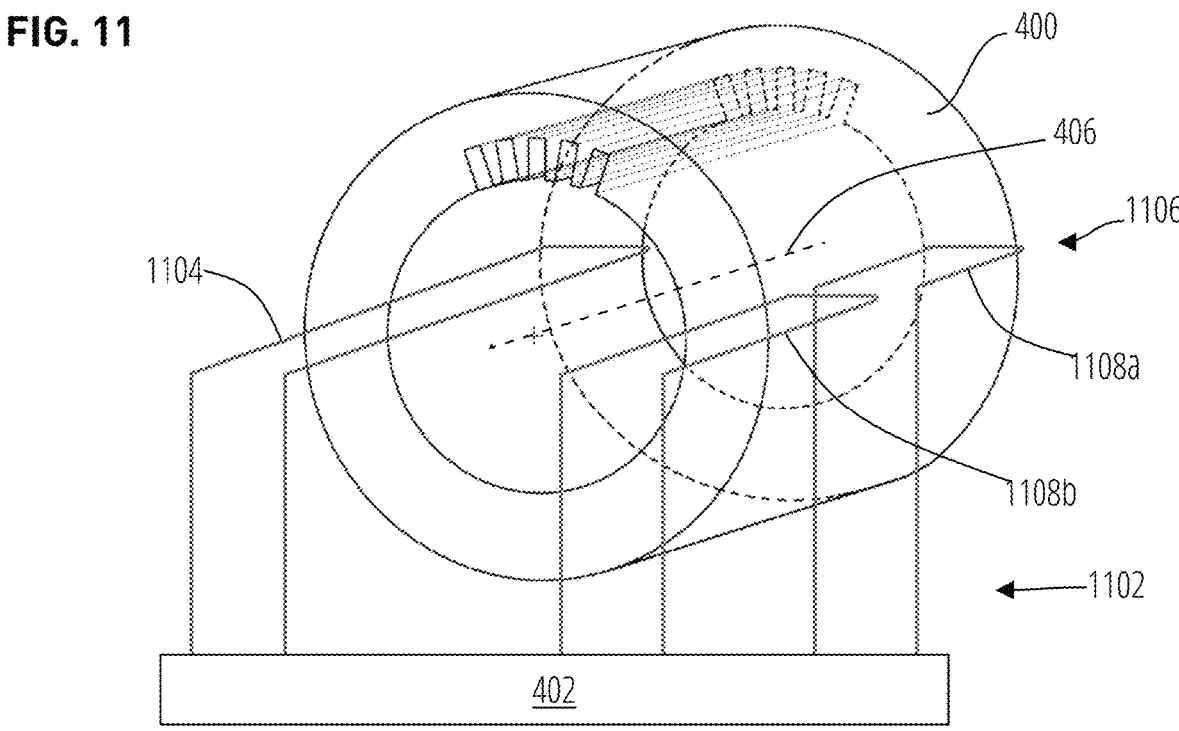
FIG. 11 is a schematic illustration of another active sensor system that is operable to detect short circuits between stator laminations.

FIG. 11 illustrates another active sensor system 1102 that includes a first coil 1104 and a second coil 1106. The first coil 1104 is arranged and operates much like the first coil 1004. The second coil includes a first subcoil 1108*a* and a second subcoil 1108*b* that cooperate to surround the same portion of the stator laminations 116 as the first coil 1104. The second coil 1106, including the first subcoil 1108*a* and the second subcoil 1108*b* are arranged much like those described with regard to FIG. 10. However, the first subcoil 1108*a* and second subcoil 1108*b* are not connected in series. Rather, the first subcoil 1108*a* generates a second signal and the second subcoil 1108*b* generates a third signal, with the second signal and the third signal being delivered separately to the detector 402.

The detector 402 compares the first signal to a combination of the second signal and the third signal to determine if there is a potential short between the stator laminations 116. In addition, the detector 402 can compare the second signal and the third signal to better define the axial location of the detected short. Specifically, the point 1202 may be selected such that the first subcoil 1008*a* and the second subcoil 1008*b* produce similar signals. Thus, a failure of the insulation layer 124 in an area surrounded by one of the first subcoil 1008*a* and the second subcoil 1008*b* produces a difference between the two signals. The first subcoil 1008*a* and the 1008*b* are connected in series so that they cooperate to define a single second signal that is then delivered to the detector 402.

Again, the sensor system 1102 could be either passive or active. If passive, each of the first coil 1104, the first subcoil 1108*a*, and the second subcoil 1108*b* are passive coils. However, the sensor system 1102 is active, the first coil 1104 would be active like the excitation coil 808. In addition, while the sensor system 1102 of FIG. 11, as well as the sensor system 1002 of FIG. 10 illustrate only the second coil 1006, 1106 as including two subcoils, other arrangements may divide the first coil 1004, 1104 into two or more subcoils. In addition, while two subcoils are illustrated, more than two subcoils could be employed if desired.

In addition, the sensor systems illustrated in FIG. 4 through FIG. 11 illustrate coils and in particular coil pairs disposed in a single plane. However, other arrangements may include coil pairs in multiple planes or multiple sets of coil pairs arranged in different planes if desired. The placement of coils, and in particular coil pairs in multiple planes allows the detector 402 to better identify the circumferential position of any detected short. By also applying the subcoil arrangements illustrated in FIG. 10 and FIG. 11 the detector 402 can also better locate the axial position of any potential short.

FIG. 12 better illustrates the arrangement of the second coil 1006 of the sensor system 1002 of FIG. 10. As can be seen, the first subcoil 1008*a* surrounds the laminations from a first end of the stator core 400 to a point 1202 between the first end and a second end of the stator core 400. The second subcoil 1008*b* extends from the point 1202 to the second end of the stator core 400 such that together, the first subcoil 1008*a* and the second subcoil 1008*b* cooperate to surround the full axial length of the stator core 400.

It should be noted that the first subcoil 1008*a* and the second subcoil 1008*b* do not need to surround the entire length of the stator core 400. However, it is desirable that they surround the same axial length of stator laminations 116 as the first coil.

As is better illustrated in FIG. 13, the first subcoil 1008*a* and the second subcoil 1008*b* are connected in series such that they form one continuous circuit that then connects to the detector 402. The single circuit operates to generate and transmit a single signal to the detector 402.

FIG. 14 illustrates an alternative arrangement of the first subcoil 1108*a* and the second subcoil 1108*b* that is consistent with the arrangement illustrated in FIG. 11. In this arrangement, each of the first subcoil 1108*a* and the second subcoil 1108*b* remain separate from one another and each connect to the detector 402 to deliver a second signal and a third signal for analysis.

As discussed, various parameters of the signals can be measured to detect failures of insulation layers 124, those parameters include:

Unbalanced voltage if two or several coils are connected in series so that instant voltage polarity in one coil applied in opposite direction for other coil or coils.

AC voltage RMS or amplitude generated in one or several coils.

AC voltage phase generated in one or several coils.

AC voltage shape versus time generated in one or several coils.

AC voltage shape versus time or harmonic content.

AC voltage and current phase in the coil.

Coil impedance reactance at specific voltage frequency.

Impedance of the coil and components connected in series at specific voltage frequency.

Natural frequency of the coil and capacitor resonance circuit.

Coil voltage and/or current response for voltage impulse of specific shape and amplitude applied to the coil or coil and capacitor circuit.

Unbalanced AC voltage and current RMS or amplitude applied and generated in the coils.

Unbalanced AC voltage shape versus time or harmonic content generated in the coils.

Applied AC voltage and current RMS or amplitude.

Applied AC voltage and current phase in the coil.

In operation, an exciter or other system provides current at a desired voltage to the rotor 200. The current flows through the rotor windings 204 to establish two magnetic poles in a two-pole generator and more poles in higher pole generators. The turbine, or other prime mover is coupled to the rotor 200 and operates to rotate the rotor 200 at a desired speed. For a synchronous generator with a two-pole rotor 200, the rotor is rotated at 3600 RPM to generate 60 Hz electricity. For electricity at 50 Hz, the rotor 200 is rotated at 3000 RPM.

The rotating magnetic field of the rotor 200 interacts with the windings 308 of the generator to induce an alternating three phase current at a frequency that is proportional to the speed of the rotor 200. Each of the rotor 200 and the stator 300 are cooled to increase the current density of the rotor 200 and the stator 300 while also maintaining a desired efficiency and maintenance interval.

One or more of the sensor systems of FIG. 4 through FIG. 14 is installed on the electric machine or generator to detect potential failures of insulation layers 124. Both active and passive sensor systems can operate passively to detect potential damage of insulation layers 124 during generator operation as described with regard to the passive systems. Active sensor systems can additionally be operated during generator operation or when the generator 100 is idle to detect potential damage to insulation layers 124. Depending on the type of system installed, the detector 402 can further indicate a potential location of any failures of the insulation layers 124.

For example, one system may include two pairs of coils arranged in two orthogonal planes that intersect along the longitudinal axis 406. The detector 402 would receive the signals from the various coils and may not only detect potential damage to one or more insulation layers 124 but may also evaluate the signal from each coil to determine which has changed in a manner indicative of a failure near that coil, thereby narrowing the location of the potentially failed insulation layer 124 to a circumferential quadrant of the stator core 400. The addition of more coil pairs would allow for even further refinement of the circumferential location of the failure. Thus, systems with three coil pairs or more than three coil pairs are also contemplated.

Furthermore, one or more of the coils could be broken into two or more axial subcoils. For example, each could be broken into four equal length subcoils that produce substantially identical signals when the stator core 400 is undamaged. When a potentially damaged insulation layer 124 is detected, the coils could be analyzed to narrow the circumferential position of the damage as described. In addition, the subcoil signals could be analyzed to narrow the axial location of the damage. While examples with two subcoils and four subcoils have been described, any number of subcoils including three or five or more could be employed to further improve the resolution of the sensor system.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element, which must be included in the claim scope: the scope of patented subject matter is defined only by the allowed claims. Moreover, none of these claims are intended to invoke a means plus function claim construction unless the exact words "means for" are followed by a participle.

What is claimed is:

1. An electric machine comprising:
   a plurality of laminations stacked along a longitudinal axis to define a stator core, each of the laminations of the plurality of laminations cooperating to define a plurality of slots that extend in a direction parallel to the longitudinal axis, the plurality of laminations including a first lamination, a second lamination, and an insulation layer between the first lamination and the second lamination;
   a plurality of windings disposed in the plurality of slots, the plurality of windings operable to conduct a current at a desired voltage and a desired frequency;
   a sensor coil surrounding a portion of the plurality of laminations, the sensor coil conducting a first signal; and
   a detector electrically connected to the sensor coil to measure the first signal and to compare the first signal to a second signal, a difference between the first signal and the second signal being indicative of a short circuit between the first lamination and the second lamination.

2. The electric machine of claim 1, wherein each of the first signal and the second signal includes an impedance, a voltage, and a waveform, and wherein a difference between one of the impedance, the voltage, and the wave form of the first signal and the second signal is indicative of the short circuit.

3. The electric machine of claim 1, wherein the sensor coil includes a first coil arranged in a plane that is parallel to the longitudinal axis.

4. The electric machine of claim 3, wherein the sensor coil includes a second coil arranged in the plane with the first coil and positioned on an opposite side of the longitudinal axis as the first coil.

5. The electric machine of claim 4, wherein the first coil and the second coil are connected in series to produce the first signal and wherein the second signal is a reference signal indicative of a stator core that is undamaged.

6. The electric machine of claim 4, wherein the first coil generates the first signal, and the second coil generates the second signal.

7. The electric machine of claim 3, wherein the sensor coil includes a second coil that is coplanar with the first coil and wherein the first coil and the second coil are disposed on the same side of the longitudinal axis and are axially separated from one another.

8. The electric machine of claim 1, wherein the first signal is measured at a first time and the second signal is measured at a second time that is prior to the first time.

9. The electric machine of claim 1, further comprising an excitation coil that surrounds a second portion of the plurality of laminations, the excitation coil operable to receive an excitation signal.

10. A method of detecting a short circuit between a first lamination and a second lamination in a plurality of laminations arranged along a longitudinal axis to define a stator core, the method comprising:
    surrounding a portion of the plurality of laminations with a first coil of a sensor coil disposed in a plane that is parallel to the longitudinal axis;
    measuring a first signal from the sensor coil;
    comparing the first signal to a second signal to identify a difference; and indicating the existence of the short circuit in response to the difference.

11. The method of claim 10, further comprising surrounding a second portion of the plurality of laminations with a second coil arranged in the plane with the first coil and positioned on an opposite side of the longitudinal axis as the first coil.

12. The method of claim 11, further comprising connecting the first coil and the second coil in series, and wherein the comparing step detects an unbalanced voltage between the first signal and the second signal which is indicative of the short circuit.

13. The method of claim 11, further comprising generating the first signal from the first coil and generating the second signal from the second coil.

14. The method of claim 10, further comprising forming a second coil that is coplanar with the first coil, the first coil and the second coil axially separated from one another and disposed on the same side of the longitudinal axis.

15. The method of claim 10, further comprising measuring the first signal at a first time and the second signal at a second time that is prior to the first time.

16. An electric machine comprising:
   a plurality of laminations stacked along a longitudinal axis;
   a plurality of insulation layers arranged such that one insulation layer is disposed between adjacent laminations of the plurality of laminations;
   a first coil positioned to surround the plurality of laminations and the plurality of insulation layers and arranged on a first side of the longitudinal axis in a plane that includes the longitudinal axis;
   a second coil positioned to surround the plurality of laminations and the plurality of insulation layers and arranged on a second side of the longitudinal axis in the plane, the second side on the opposite side of the longitudinal axis as the first side, the first coil and the second coil connected in series;
   a detector electrically connected to the first coil and the second coil to measure a first signal and to compare the first signal to a reference signal, a difference between the first signal and the reference signal being indicative of a damaged insulation layer.

17. The electric machine of claim 16, wherein the first signal is generated in response to operation of the electric machine and the reference signal is a zero-voltage signal.

18. The electric machine of claim 16, wherein the second coil includes a first subcoil that surrounds a first axial portion of the plurality of laminations and a second subcoil that surrounds a second axial portion of the plurality of laminations.

19. The electric machine of claim 18, wherein the first subcoil and the second subcoil are connected in series.

20. The electric machine of claim 16, further comprising an excitation coil positioned to surround the plurality of laminations and the plurality of insulation layers and arranged in a second plane that includes the longitudinal axis, the excitation coil operable to generate an excitation signal and the first signal generated in response to the excitation signal.

* * * * *